(12) United States Patent
Yamashita

(10) Patent No.: US 6,509,127 B1
(45) Date of Patent: Jan. 21, 2003

(54) METHOD OF ELECTRON-BEAM EXPOSURE

(75) Inventor: Hiroshi Yamashita, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/670,540

(22) Filed: Sep. 27, 2000

(30) Foreign Application Priority Data

Oct. 19, 1999 (JP) .......................................... 11-296886

(51) Int. Cl.[7] .................................................. G03C 5/00
(52) U.S. Cl. ......................... 430/30; 430/296; 430/942
(58) Field of Search ........................... 430/30, 296, 942

(56) References Cited

U.S. PATENT DOCUMENTS 6,140,020 A * 10/2000 Cummings .................. 430/296

FOREIGN PATENT DOCUMENTS

| JP | 3-101214 | 4/1991 |
| JP | 6-163371 | 6/1994 |
| JP | 10-97055 | 4/1998 |
| JP | 10-274841 | 10/1998 |
| JP | 11-176720 | 7/1999 |

OTHER PUBLICATIONS

G. Patrick Watson et al., "A Background Dose Proximity Effect Correction Technique for Scattering with Angular Limitation Projection Electron Lithography Implemented in Hardware," 1995, J. Vac. Sci. Technol., B 13(6), pp. 2504–2507, *American Vacuum Society*.

* cited by examiner

*Primary Examiner*—Christopher G. Young
(74) *Attorney, Agent, or Firm*—Young & Thompson

(57) ABSTRACT

A scattering-angle limiting type electron-beam exposure method in which a mask having a scattering region is used, and a limiting aperture is set to control the amount of electrons scattered by the mask that pass through the limiting aperture, whereby a scattering contrast is formed from differences in the scattering angles of electrons. By changing the thickness of the scattering region of the mask according to the pattern density, the scattering angles of the scattered electrons are controlled and the amount of the scattered electrons that pass through the limiting aperture is adjusted.

7 Claims, 13 Drawing Sheets

(a)

(b)

(c)

(d)

(e)

(a)

(b)

METHOD OF ELECTRON-BEAM EXPOSURE

BACKGROUND OF THE INVENTION

1. Field of the Invention

The present invention relates to a method of electron-beam exposure that is mainly employed to manufacture a semiconductor device, and a mask as well as an electron-beam exposure system used therein, and more particularly to a mask for electron-beam exposure that is especially suited for the proximity effect correction in the scattering-angle limiting type electron-beam exposure method.

2. Description of the Related Art

In the electron-beam exposure, the proximity effect that may be caused by scattered electrons in a resist layer and within a substrate strongly affects the linewidth accuracy of patterns, which makes the proximity effect correction one of the essential techniques in the art.

In the cell projection lithography which is the most widely used method of electron-beam exposure, in order to obtain the amount of the correction dose, the dose compensation method which requires complicated calculations by the self-consistent method using the exposure intensity distribution (EID) function or the pattern density method has been currently used.

Meanwhile, in the scattering-angle limiting type (referred to as "SAL type", hereinafter) electron-beam exposure method which has been, in recent years, attracting much interest as a next-generation electron-beam exposure technique, the correction of the proximity effect is conducted by a compensation method based on the GHOST method. The SAL type electron-beam exposure method employs the segmented transcription method in which patterns for the whole chip to be exposed. are set in a mask and, through scanning this mask, patterns are transcribed to a wafer. An exposure system used in this electron-beam exposure method is described in a later section, together with the GHOST method, in detail.

With respect to a mask for this SAL type electron-beam exposure method, there is used a mask (referred to as a "scattering membrane mask", hereinafter) in which patterns made of an electron-beam scatterer, for example, tungsten with a thickness of 50 nm or so, is formed on an electron-beam transmittable membrane (referred to simply as a "membrane", hereinafter) with a relatively small electron-beam scattering power, for example, a silicon nitride film with a thickness of 100 nm or so. The exposure is carried out by an electron beam consisting of electrons which are not scattered or scattered only with relatively small scattering angles, having transmitted the membrane, and the image contrast is formed on the wafer due to the difference of the electron-beam scattering between the membrane region and the scatterer region.

In the SAL type electron-beam exposure method, the proximity effect correction is performed as follows. Firstly, some of electrons that are scattered by the scatterer placed on this scattering membrane mask are selectively allowed to pass through an annular opening which is set in a limiting aperture section disposed at the position or in the vicinity of the crossover, and then these scattered electrons allowed to pass are defocused to about the back-scattering range by spherical and chromatic aberrations of an object lens and used as a correction beam to irradiate the wafer. In contrast with a conventional GHOST method wherein the weak correction exposure is performed separately from the primary exposure, with the beam formed by defocusing the inverse pattern of the pattern intended for the primary exposure over the back-scattering range, this technique is characterized in that the proximity effect correction is achieved by carrying out the correction exposure simultaneously with the pattern exposure. Such proximity effect correction as can be implemented by performing the correction exposure simultaneously with the pattern exposure may well contribute to improvement in a throughput. The method of proximity effect correction of this sort has been already reported by G. P. Watson et al. in J. Vac. Sci. Technol., B 13(6), pp.2504–2507 (1995).

As against this, as a mask (referred to as a "stencil mask", hereinafter) utilized in the cell projection lithography or employed in an apparatus (a cell projection lithography type electron-beam exposure system) for this method, there is generally used a mask in which an opening pattern is formed in a substrate that does not allow the electron beam to transmit, for instance, a silicon substrate with a thickness of not less than 20 $\mu$m for 50 keV electron beam.

Accompanied with achievement of higher integration of a semiconductor device, as the miniaturization of patterns proceeds, however, a stencil mask made of a thick substrate as described above has started to have the following problems. Namely, when manufacturing a mask, it is difficult to form an opening pattern in a silicon substrate as thick as 20 $\mu$m with accuracy so that the variation in size is produced. Further, in respect of the electron-beam exposure, because the mask absorbs the electron-beam and generates heat, problems of lowered durability and variation of the mask position through thermal expansion may arise. Moreover, since there is a requirement to increase the accelerating voltage still further so as to reduce the aberration of the electron optical system and improve the resolution, the mask substrate tends to become thicker causing the above problems more significant.

With the stencil mask, if the mask substrate is made thinner, although the linewidth accuracy of the opening pattern is raised and the amount of heat generation is lowered, the electron beam which should be blocked in the first instance may be allowed to transmit the mask substrate section (non-opening section). As a result, a region of the resist on the wafer that should not be exposed may be exposed, which leads to a poor contrast and a low resolution.

Accordingly, with the object of solving these problems of the stencil mask in the cell projection lithography, in Japanese Patent Application Laid-open No. 97055/1998, there is disclosed a mask for electron-beam exposure, wherein an opening pattern is formed in a relatively thin mask substrate, and, in addition, an electron-beam scattering layer is formed on the backside of the mask for the purpose of scattering the electron-beam that has transmitted said mask. This electron-beam scattering layer may be a layer made of polycrystal such as polysilicon, tungsten silicide, molybdenum silicide, titanium silicide or the like or a uneven layer. It is described, therein, through formation of such an electron-beam scattering layer, the electrons that may transmit the pattern layer of the mask (the non-opening section of the substrate) can be successfully prevented from entering into the wafer.

Further, Japanese Patent Application Laid-open No. 163371/1994 discloses an electron-beam writing apparatus in which an opening is set in a substrate having a thickness less than an electron penetration depth to provide an electron-beam shaping aperture that is used as a mask and further, on the downstream side from the above-mentioned shaping aperture in the electron optical system, a mechanism is set to cut off scattered electrons which have transmitted the substrate section of the shaping aperture (mask). In this invention, there is provided a mechanism to cut off the scattered electrons which have transmitted the substrate section of the shaping aperture by setting a limiting diaphragm of a small diameter in a crossover plane so that only electrons which have passed through the opening section of the mask may be allowed to pass through, while the scattered electrons by the mask substrate section are removed by the limiting diaphragm plate. In addition, another cutting-off mechanism is described therein. Namely, an energy filter is set, and thereby decelerated electrons which have lost a part of their energy by penetrating the mask substrate section are deflected further and then removed by the limiting diaphragm.

As described above, some of stencil masks used in the cell projection lithography, by becoming thinner, may produce scattered electrons. Irradiation of the wafer with these scattered electrons causes a reduction of contrast and a lowering of the resolution so that, in cell projection lithography, it is necessary to provide a means to prevent the scattered electrons from reaching the wafer.

Further, stencil masks are, so far, used solely in the cell projection lithography and no case in which a stencil mask is used in SAL type electron beam exposure method has been reported other than the one by the present inventor.

Now, the proximity effect correction in the SAL type electron-beam exposure method has, hitherto, the following problems.

In general, the correction exposure for one shot of the pattern exposure is always made with a considerably large uniform dose (back-scattering coefficient η) throughout, independent of the pattern density distribution. This brings about a decrease in contrast, resulting in a poor resolution and a small exposure dose margin.

The dose of the correction exposure is normally adjusted by a diameter and a width of an annular opening formed in a limiting aperture section. As this control of the dose of the correction exposure is designed for the whole one pattern, it is impossible, within one pattern region, to adjust the dose of correction exposure to the distribution of the pattern density.

Further, in some wafers, the extent of the proximity effect varies with the underlying pattern. Especially when an underlying pattern of an interconnection or the like is formed of a heavy metal such as tungsten or the like in an underlying layer under the resist layer that is placed on the wafer surface, the image-forming electrons are reflected or back-scattered by that underlying pattern and, consequently, the extents of the proximity effect may become different between the resist region over the region where no underlying pattern is formed and the resist region over the underlying pattern formation region. Even in such a case, hitherto, the dose of the correction exposure cannot be changed within one pattern region so that the adjustment of the dose, according to the underlying pattern, cannot be made.

Meanwhile, in Japanese Patent Application Laid-open No. 274841/1998, the present assignee identified a problem in the proximity effect that, in full pattern writing type electron-beam exposure method or in cell projection lithography, the densities of opening patterns in a stencil mask are different between the central section and the edge section of the cell arrays (because no pattern is formed in the vicinity of the edge section of the cell array) so that the dimension of the patterns transcribed onto a resist varies, and disclosed a mask characterized in that the thickness of the mask substrate is varied with the position so as to change the amount of the electron beam transmitting the mask substrate according to the density of the opening patterns in a stencil mask and an electron-beam exposure method therewith. Further, in a paragraph (0029) in that publication, it is described, "Through a change in the thickness of the mask substrate according to the density of the opening patterns in a stencil mask, the amount of electron beam transmitting the non-opening section can be controlled. Namely, in a mask part corresponding to the array central section where the opening patterns are dense, the amount of transmitting electron beam can be reduced, while in a mask part corresponding to the array edge section where the opening patterns are sparse, the amount of transmitting electron beam can be raised. Accordingly, it is possible to attain the identical pattern dimension for the array central section and the array edge section and correct the adverse influence of the proximity effect satisfactorily. It is further described, "Since an exposure of the whole pattern can be made with one shot, this method can improve a throughput."

As seen clearly in this description, the invention disclosed in the above publication is made to correct the proximity effect merely through differences in the rate of the electron transmission, under the assumption that the electrons transmitting non-opening sections are all non-scattered electrons travelling straight on, neglecting any scattered electrons. In short, in this method, the exposure is to be made with the inverse patterns as they are, for which the amount of the transmitting electron beam varies with the pattern density of the original patterns.

This method altogether differs from the so-called GHOST method in which the proximity effect is corrected by performing the weak correction exposure with the beam that is formed by defocusing the inverse pattern of the primary pattern (the positive pattern) over the back-scattering range. In the method described in the above publication, in order to correct the proximity effect, the exposure of the inverse pattern is performed simultaneously with the positive pattern, the inverse pattern without being defocused, so that the image contrast becomes considerably low, which indicates that this method is not suited for the formation of fine patterns. Moreover, because the amount of the transmitting electron beam for the inverse patterns varies with the pattern density of the primary patterns, the contrast also varies with the pattern density and, thus, the linewidth accuracy becomes low.

SUMMARY OF THE INVENTION

An object of the present invention is, in the SAL type electron-beam exposure method wherein the proximity effect correction by the GHOST method is simultaneously carried out during the pattern exposure, to adjust the correction dose to the pattern density, and thereby to increase the contrast, improve the resolution and enlarge the dose margin. Another object of the present invention is to improve the linewidth accuracy of the pattern through the adjustment of the correction dose to the back-scattering to which the underlying pattern contributes. A further object of the present invention is to provide a mask for electron-beam exposure and an electron-beam exposure system used in this method.

In accordance with the first aspect of the present invention, there is presented a scattering-angle limiting type electron-beam exposure method in which a mask having a scattering region is used, and a limiting aperture is set to control the amount of scattered electrons that are scattered by said mask to pass through, whereby a scattering contrast is formed from differences in the scattering angles of electrons within the electron beam having passed through said mask, and thereby pattern exposure is performed; wherein by changing the thickness of the scattering region of the mask according to the pattern density, the scattering angles of the scatter ed electrons are controlled and the amount of the scattered electrons to pass through the limiting aperture is adjusted, and, using these scattered electrons after passing through said limiting aperture for the correction exposure, the proximity effect correction is simultaneously performed during the pattern exposure.

In accordance with the second aspect of the present invention, there is presented the electron-beam exposure method as described as the first aspect, wherein said mask has a structure in which a scattering region made of an electron-beam scatterer with a prescribed pattern is formed over an electron-beam transmittable thin film.

In accordance with the third aspect of the present invention, there is presented the electron-beam exposure method as described as the first aspect, wherein said mask is a mask in which an opening pattern is formed by setting an opening section in the substrate, and said substrate has a scattering region thinner than the electron penetration depth, and said scattering region, having said opening pattern formed therein, includes a region corresponding to a back-scattering range in the wafer.

In accordance with the fourth aspect of the present invention, there is presented the electron-beam exposure method as described as the third aspect, wherein said mask is one of a set of complementary masks that form a prescribed pattern by combining a plurality of mask patterns;

the scattering angles of the scattered electrons are controlled by-setting the thickness of the scattering region of each complementary mask in such a way that the total correction dose for a plurality of exposures which are performed, using a set of these complementary masks, as many times as the number of masks required to form a prescribed pattern, equals to the correction dose when a prescribed pattern is formed using only one mask and through only one exposure; and simultaneously with forming a prescribed pattern by carrying out exposures as many times as required, using a set of these complementary masks, the proximity effect correction is performed, using the scattered electrons after passing through the limiting aperture for the correction exposure.

In accordance with the fifth aspect of the present invention, there is presented a scattering-angle limiting type electron-beam exposure method in which a mask having a scattering region is used, and a limiting aperture is set to control the amount of scattered electrons that are scattered by said mask to pass through, whereby a scattering contrast is formed from differences in the scattering angles of electrons within the electron beam having passed through said mask, and thereby pattern exposure is performed; wherein said mask has a structure in which a scattering region made of an electron-beam scatterer with a prescribed pattern is formed over an electron-beam transmittable thin film; and by changing the thickness of the electron-beam scatterer of the mask according to the back-scattering to which the underlying pattern of the wafer contributes, the scattering angles of the scattered electrons are controlled and the amount of the scattered electrons to pass through the limiting aperture is adjusted, and, using these scattered electrons after passing through said limiting aperture for the correction exposure, the proximity effect correction is simultaneously performed during the pattern exposure.

In accordance with the sixth aspect of the present invention, there is presented the electron-beam exposure method as described as the first aspect, wherein, in the scattering region of the mask that corresponds to the underlying pattern of the wafer and the back-scattering range to which said underlying pattern contributes, the thickness of the scattering region of the mask is set, while taking the back-scattering to which the underlying pattern contributes into account, whereby the scattering angles of the scattered electrons are controlled and the amount of the scattered electrons to pass through the limiting aperture is adjusted, and, using these scattered electrons after passing through said limiting aperture for the correction exposure, the proximity effect correction is simultaneously performed during the pattern exposure.

In accordance with the seventh aspect of the present invention, there is presented the mask for electron-beam exposure that is used in the method described as the first aspect, wherein, in order to control the scattering angle of the scattered electrons, the thickness of the scattering region of the mask is changed in such a way that the proximity effect correction may be performed with correction dose appropriate to the pattern density.

In accordance with the eighth aspect of the present invention, there is presented the mask for electron-beam exposure as described as the seventh aspect, which has a structure in which a scattering region made of an electron-beam scatterer with a prescribed pattern is formed over an electron-beam transmittable thin film.

In accordance with the ninth aspect of the present invention, there is presented the mask for electron-beam exposure as described as the seventh aspect, wherein an opening pattern is formed by setting an opening section in the substrate, and said substrate has a scattering region thinner than the electron penetration depth, and said scattering region, having said opening pattern formed therein, includes a region corresponding to a back-scattering range in the exposed substance.

In accordance with the tenth aspect of the present invention, there is presented a set of complementary masks for the electron-beam exposure that are used in the method described as the fourth aspect, which form a prescribed pattern by combining a plurality of mask patterns; and the thickness of the scattering region of each complementary mask is set in such a way that the total correction dose for a plurality of exposures which are performed, using a set of these complementary masks, as many times as the number of masks required to form a prescribed pattern, equals to the correction dose when a prescribed pattern is formed using only one mask and through only one exposure.

In accordance with the eleventh aspect of the present invention, there is presented the mask for electron-beam exposure that is used in the method described as the fifth aspect; which has a structure in which a scattering region made of an electron-beam scatterer with a prescribed pattern is formed over an electron-beam transmittable thin film; wherein in order to control the scattering angle of the scattered electrons, the thickness of the electron-beam scatterer is changed in such a way that the proximity effect correction may be performed with correction dose appropriate to the back-scattering to which the underlying pattern of the wafer contributes.

In accordance with the twelfth aspect of the present invention, there is presented a scattering-angle limiting type electron-beam exposure system, wherein a mask having a scattering region is used, and a limiting aperture is set to control the amount of scattered electrons that are scattered by said mask to pass through, whereby a scattering contrast is formed from differences in the scattering angles of electrons within the electron beam having passed through said mask, and thereby pattern exposure is performed; wherein said mask is any mask described as an aspect among the seventh to eleventh aspects; and said limiting aperture comprises an opening in the central section and a closed zonal opening disposed around said opening in the central section for controlling the amount of scattered electrons to pass through, whereby the correction exposure is provided for the proximity effect correction simultaneously performed during the pattern exposure.

The present invention can adjust the correction dose to the pattern density and thereby increase the contrast, improve the resolution and enlarge the dose margin, in the SAL type electron-beam exposure method wherein the proximity effect correction by the GHOST method is simultaneously carried out during the pattern exposure. Further, in the present invention, through an adjustment of the correction dose to the back-scattering to which the underlying pattern contributes, the linewidth accuracy of the pattern can be improved. Moreover, a mask for electron-beam exposure and an electron-beam exposure system suitable to use in this method can be provided.

DETAILED DESCRIPTION OF THE PREFERRED EMBODIMENTS

Taking the cases of the preferred embodiments, the present invention is described in detail below.

<Basic Structure of a SAL Type Electron-Beam Exposure System>

Figure 1:
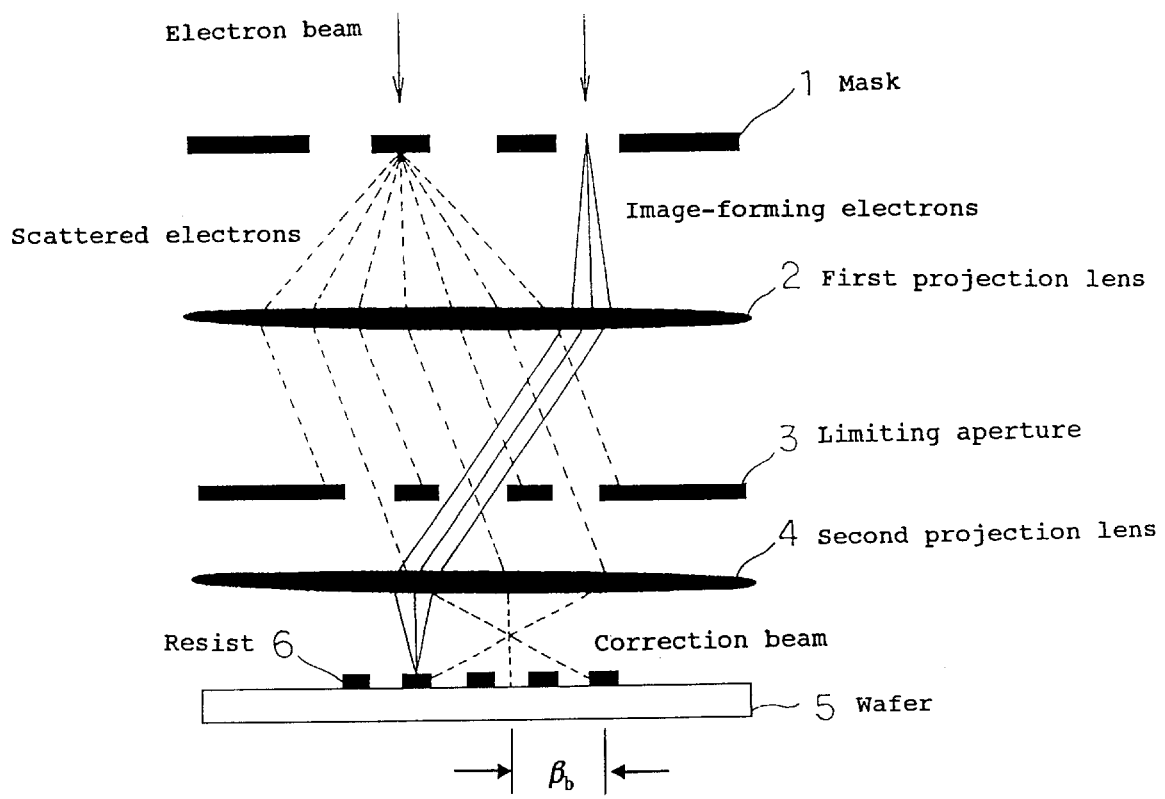
FIG. 1 is a schematic diagram in explaining the basic structure of a scattering-angle limiting type electron-beam exposure system according to the present invention.
Figure 2:
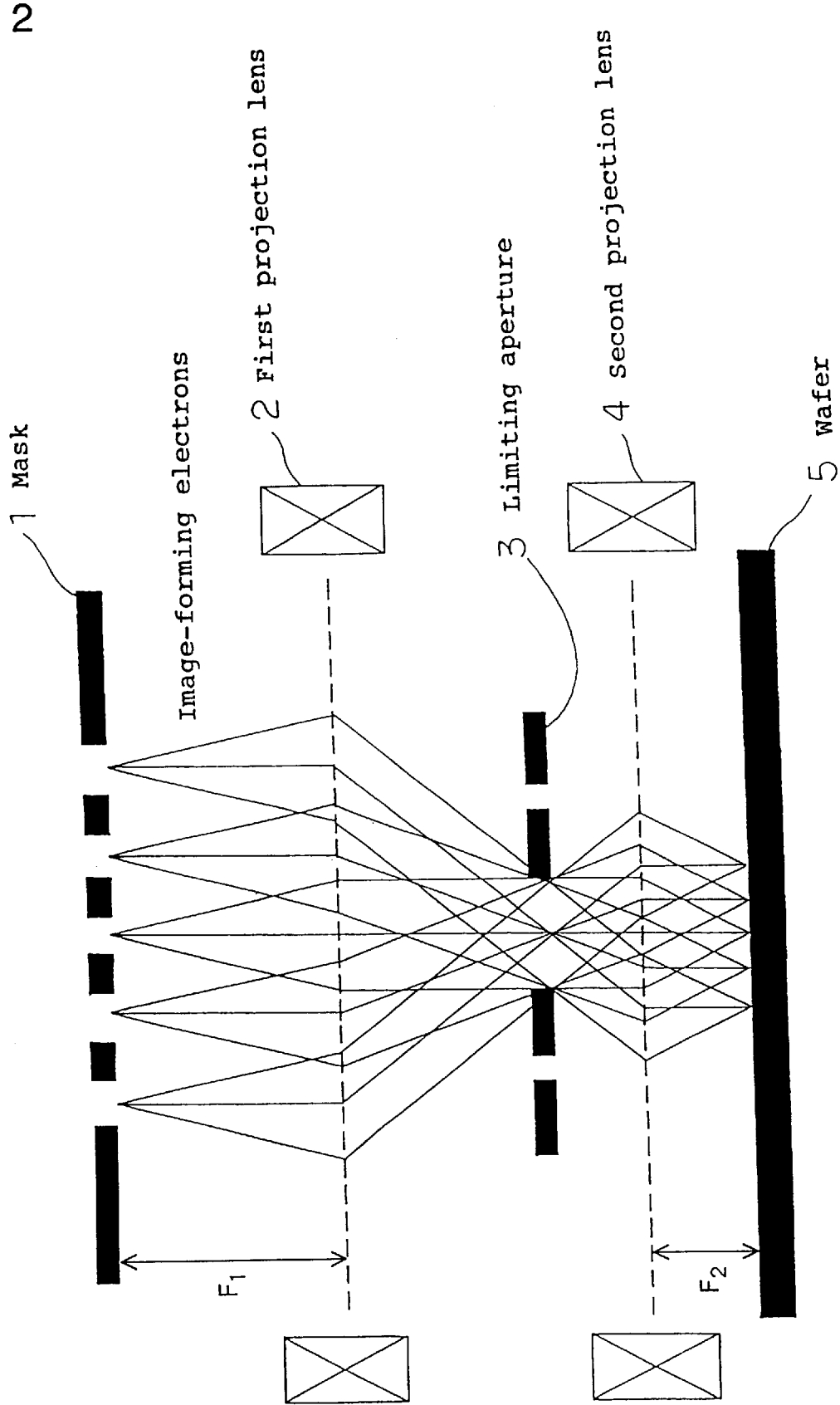
FIG. 2 is a schematic diagram in explaining the basic structure of a scattering-angle limiting type electron-beam exposure system according to the present invention.

Firstly, referring to schematic diagrams of FIGS. 1 and 2, the basic structure of a SAL type electron-beam exposure system in which correction exposure is carried out simultaneously with the pattern exposure and thereby the proximity effect correction can be made is described below. In FIG. 1, hereat, trajectories of some of scattered electrons and image-forming electrons are shown, while, in FIG. 2, trajectories of some of image-forming electrons alone are shown.

Image-forming electrons passing through a mask 1 are focused by a first projection lens 2, and the pass through a central opening in a limiting aperture section 3, that is disposed in the crossover plane or the back-focal plane, and subsequently form an image on a resist 6 on a wafer 5 by a second projection lens 4. The resist 6 in FIG. 1 is a negative one, of which an irradiated portion is to remain, and showing the form after development for illustration, although the resist used in the present invention can be a positive one. Further, the first and the second projection lenses constitute a doublet optics.

Meanwhile, most of electrons scattered by the mask 1 are blocked by the limiting aperture 3 and only a small part of the electrons pass through the central opening and a closed zonal opening that surrounds the central opening. These mask-scattered electrons passed therethrough are defocused to about a back-scattering range by the spherical and the chromatic aberrations of the second projection lens 4, and distributed over the wafer as a correction beam. The central and the closed zonal openings are concentrically disposed and the closed zonal opening may be annular or zonal in the form of outlines of a polygon such as a rectangle or a square. It is generally annular, but may take the shape of a polygonal frame such as a rectangular or a square one, depending on an aperture material and manufacturing conditions. A rib is generally provided for connecting the periphery with the inside of the closed zonal opening, and this rib can be widened to the extent the closed zonal opening is even partially closed as long as required proximity effect correction can be obtained.

The intensity of the correction beam and, therefore, the correction dose that is proportional to the intensity is normally controlled by the area of the closed zonal opening, and the range of defocusing, by the distance of the closed zonal opening from the center of the limiting aperture; for an annular opening, by changing its size. Since the opening area of the closed zonal opening is larger than that of the central opening, the proximity effect correction, in practice, mostly depends on the scattered electrons passing through the closed zonal opening. Further, in the actual design of a limiting aperture for exposure, as the back-scattering range largely depends on the wafer material and the accelerating voltage, under the same conditions of the wafer material and accelerating voltage, the position of a closed zonal aperture with respect to the center of the limiting aperture is set constant (the degree of defocusing is constant), and only the correction dose is adjusted by changing the width of the zone of the closed zonal opening (the opening area). <Basic Principle of Proximity Effect Correction>

Figure 3:
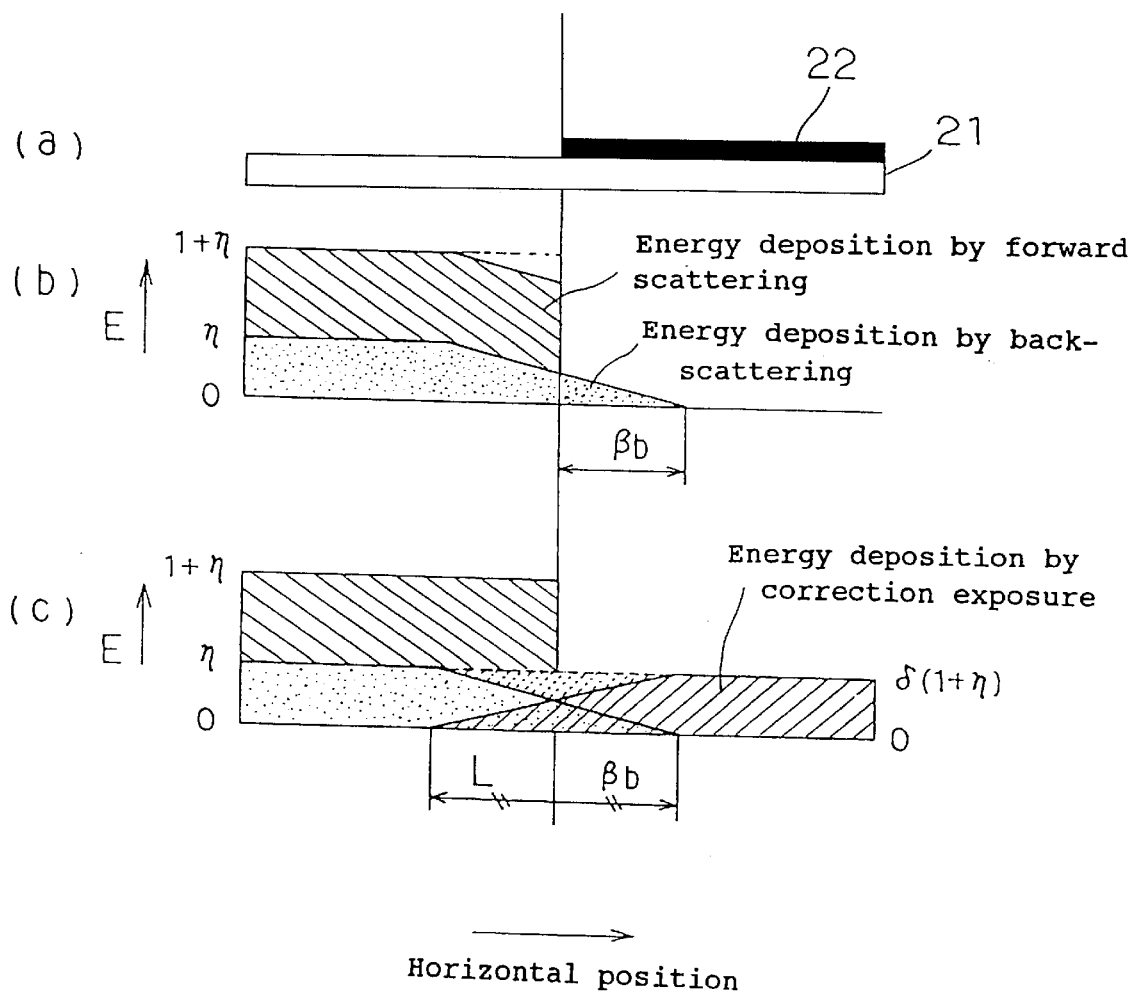
FIG. 3 is a schematic diagram in explaining the basic principle of proximity effect correction according to the present invention.
Figure 4:
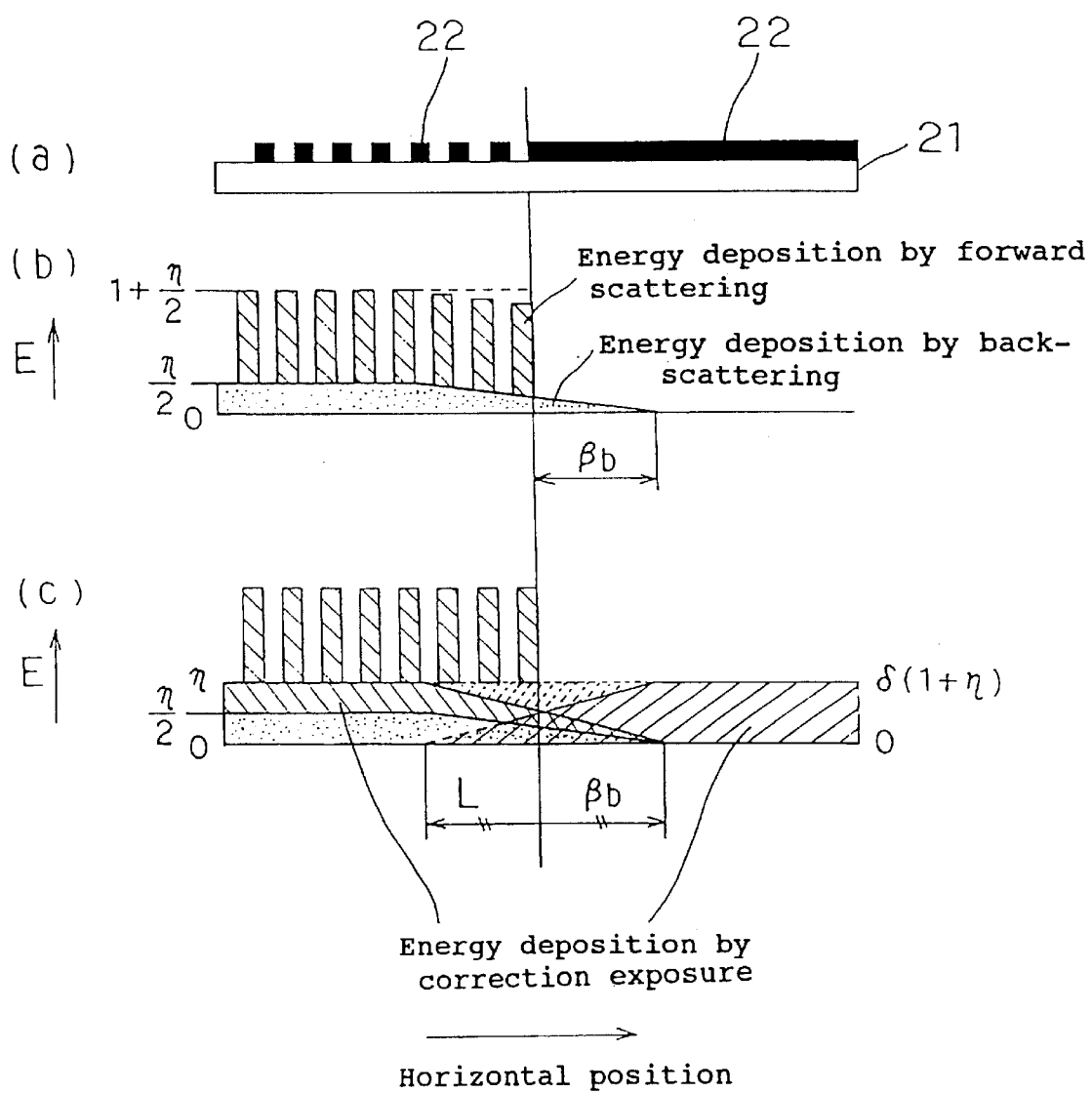
FIG. 4 is a schematic diagram in explaining the basic principle of proximity effect correction according to the present invention.

Next, referring to FIGS. 3 and 4, the basic principle of proximity effect correction is described. The description herein is made, using a conventional scattering membrane mask so as to make, in the mask, a distinction between an electron-beam scattering region and an electron-beam transmitting region (referred to simply as "transmitting region" hereinafter) that has a relatively small electron-beam scattering power.

FIG. 3(a) shows a scattering membrane mask, and referential numerals 21 and 22 indicate a membrane (an electron-beam transmittable thin film) and a scatterer layer, respectively. FIG. 3(b) shows a distribution of energy deposition in the resist on the wafer when using a limiting aperture without a closed zonal opening and providing no correction beam, in other words, when making no proximity effect correction, while FIG. 3(c) shows a distribution of energy deposition when using a limiting aperture with a closed zonal opening and providing a correction beam, in other words, when making proximity effect correction. In the drawings, βb is a back-scattering range. Assuming the energy of the forward-scattering electrons is 1, the back-scattering electrons have an energy corresponding to the back-scattering coefficient η, and the correction dose ratio δ required in this instance is given by η/(1+η).

By defocusing the correction beam to about the back-scattering range βb or L, the deposition energy, which has been lowered near the borderline, as seen in FIG. 3(b), can be brought to a constant level, as seen in FIG. 3(c). This results in an improvement of a linewidth accuracy of the pattern.

In FIG. 4, the scattering membrane mask in FIG. 3(a) is replaced with a mask on which there is formed a line and space pattern (1/1), in other words, a pattern with a pattern density of 50%. As clearly seen in FIG. 4, even when the pattern density is changed, the proximity effect correction can be made in the same way and, unlike in the conventional GHOST method, there is no need to perform a separate correction exposure of a inverse pattern which further requires a complicated calculation for each pattern.

<Function and Effect of a Mask of the Present Invention>

Figure 5:
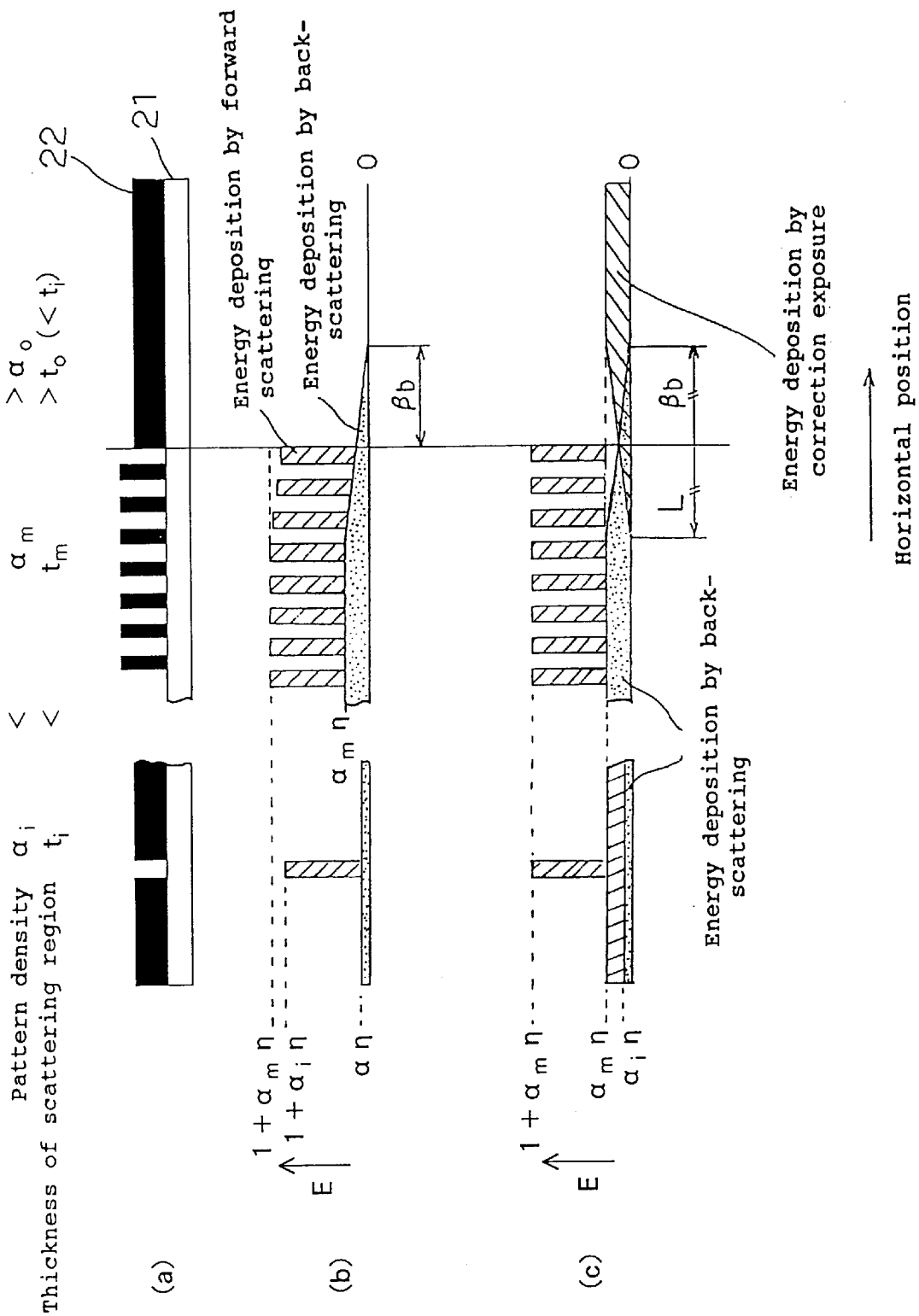
FIG. 5 is a schematic diagram showing the distribution of energy deposition obtained when an electron-beam exposure is performed using a mask according to the present invention.
Figure 6:
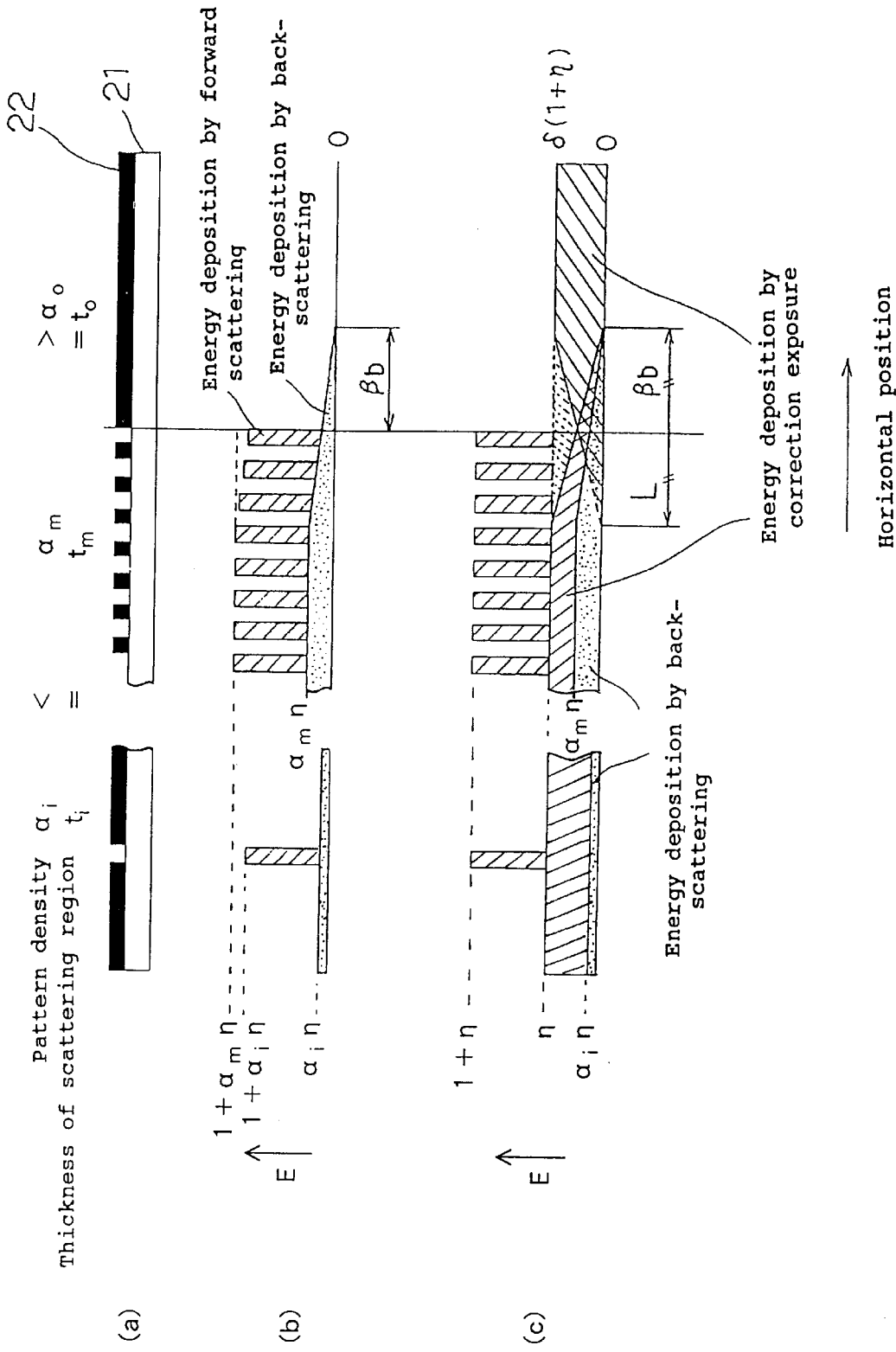
FIG. 6 is a schematic diagram showing the distribution of energy deposition obtained when an electron-beam exposure is performed using a conventional mask.

Next, referring to FIGS. 5 and 6, there are described the function and the effect obtained when electron-beam exposure is made, using a mask of the present invention in which the thickness in the scattering region is varied according to the pattern density. FIG. 5 is a schematic diagram showing the distribution of energy deposition in a resist for electron-beam exposure performed with a scattering membrane mask of the present invention, while FIG. 6, shown for comparison, is a schematic diagram showing the distribution of energy deposition with a conventional scattering membrane mask (the thickness of the scatterer layer 22 is constant). In each case of FIGS. 5 and 6, FIG. (c) shows a cross-sectional view of a scattering membrane mask. In the case of a stencil mask, no membrane corresponding to the membrane 21 is present, and the scatterer layer 22 is replaced with a substrate made of silicon or the like in which an opening pattern is formed. FIG. (b) represents the case without proximity effect correction, that is, the case a limiting aperture used therein has no annular opening but only the central opening, and no correction exposure is performed, while FIG. (c) represents the case with proximity effect correction, that is, the case a limiting aperture used therein has an annular opening around the central opening, and, with the correction beam being provided, proximity effect correction is simultaneously performed during the pattern exposure. Further, the pattern density as used in the present invention denotes, in theory, the pattern density of a region contained within the back-scattering range from the incident point of the electron beam.

Without proximity effect correction being made, variation of deposited energy arises where the pattern density changes with the position, which can be seen, for example, in an isolated pattern and between the central section and edge section of a pattern, as shown in FIGS. (b) of both FIGS. 5 and 6. When proximity effect correction is performed, the deposited energy becomes constant at all events, independent of the pattern density, as shown in FIGS. 5(c) and 6(c). This improves the linewidth accuracy of patterns.

In the present invention, in order to improve the contrast of the deposited energy between the exposed section and the unexposed section, raise the resolution and increase the dose margin, the thickness of the scattering region (the scatterer layer 22) of the mask is changed according to the pattern density α, as shown in FIG. 5(a). By changing the thickness of the scattering region of the mask, the scattering angle of the scattered electrons can be controlled and, consequently, the amount of the scattered electrons passing through the limiting aperture can be adjusted. In effect, in the conventional scattering membrane mask, the correction dose can be adjusted only for a mask as a whole because the scatterer layer therein has a constant thickness. As against this, in the present invention, even within one mask pattern, the correction dose can be partially adjusted according to the pattern density. By changing the thickness of the scattering region of the scattering region of the mask according to the pattern density in this way, irradiation of the correction beam with the minimum dose required to a given pattern density becomes possible and, as a result, the contrast can be made higher, the resolution, better and the margin of the dose, larger. Further, if the maximum electron intensity for the exposed section is denoted by $I_{max}$ and the minimum electron intensity for the unexposed section, by $I_{min}$, the exposure contrast C is given by $C=(I_{max}-I_{min})/(I_{max}+I_{min})$. For the practical exposure, as the electron intensity is proportional to the energy, the contrast $C_E$ of the deposited energy can be expressed by $C_{E=}(E_{max}-E_{min})/(E_{max}+E_{min})$, where $E_{max}$ is the maximum deposited energy and $E_{min}$ is the minimum deposited energy.

Further, with reference to the drawing, when a conventional scattering membrane mask having a scattering region with a constant thickness, as shown in FIG. 6, is used, correction exposure with a constant dose η that is a considerable amount is applied to the entire surface of the wafer, regardless of the pattern density a so that the energy deposition by the correction exposure becomes large. In contrast with this, when a mask of the present invention in which the thickness ($t_o<t_i<t_m$) of the scattering region is changed according to the pattern density ($\alpha_o<\alpha_i<\alpha_m$) as shown in FIG. 5 is used, the correction dose is adjusted to the pattern density so that the energy deposition by the correction exposure becomes small. Especially in the pattern region with the maximum pattern density $\alpha_m$ the correction dose can be reduced such an extent that the energy deposition by the correction exposure almost disappear outside of the back-scattering range L from the borderline. As described above, in the present invention, the proximity effect correction performed by correction exposure does not much lower the contrast. Therefore, compared with the case that a conventional mask is utilized, the resist pattern produced has a cross-sectional form of high quality (with a high resolution) and the dose margin can be set large.

<Structure of a Mask for Electron-Beam Exposure>

Next, the structure of a mask for electron-beam exposure according to the present invention is described below. In the present invention, by increasing the thickness of the scattering region of the mask, the scattering angle of scattered electrons can be made larger and the correction dose, smaller, while by decreasing the thickness, the scattering angle can be made smaller and the correction dose, larger. As for the structure, there can be considered two sorts of the structure; one is a developed form of the conventional scattering membrane mask and the other, a developed form of the conventional stencil mask.

An example of a mask of the present invention that is developed from a conventional scattering membrane mask is shown in FIG. 5(a). In this mask, the thickness of a scatterer layer 22 formed over an electron-beam transmittable thin film (membrane 21) in a scattering membrane mask is made to vary according to the pattern density. For the electron-beam transmittable thin film, a silicon nitride film with a thickness of 50 to 150 nm can be used. As a scatterer, a tungsten (W) layer, a W/C layered film or the like with a thickness of 50 nm or so can be formed over the thin film as described above and then patterned. Other scatterer layer materials possible to use include heavy metals such as chromium, molybdenum, titanium, gold and platinum and polycrystal materials such as polysilicon, tungsten silicide, molybdenum silicide, titanium silicide and the like. As for the material and the manufacturing method of the scattering membrane mask, more can be found, for example, in SPIE, Vol. 3236 pp. 190 (1998).

On the other hand, with a conventional stencil mask, an opening pattern is formed in a substrate thick enough to absorb (block) all or almost all image-forming electrons, and the pattern formation is carried out using n absorption contrast of the image-forming electrons. As a mask (referred to as a "scattering stencil mask" hereinafter) of the present invention, it can be produced, by using a relatively thick substrate, forming therein a thinner scattering region that allows the electron beam to transmit considerably and scatters the electron beam sufficiently, and then forming an opening pattern in this scattering region and changing the thickness of the scattering region according to the pattern density.

Figure 7:
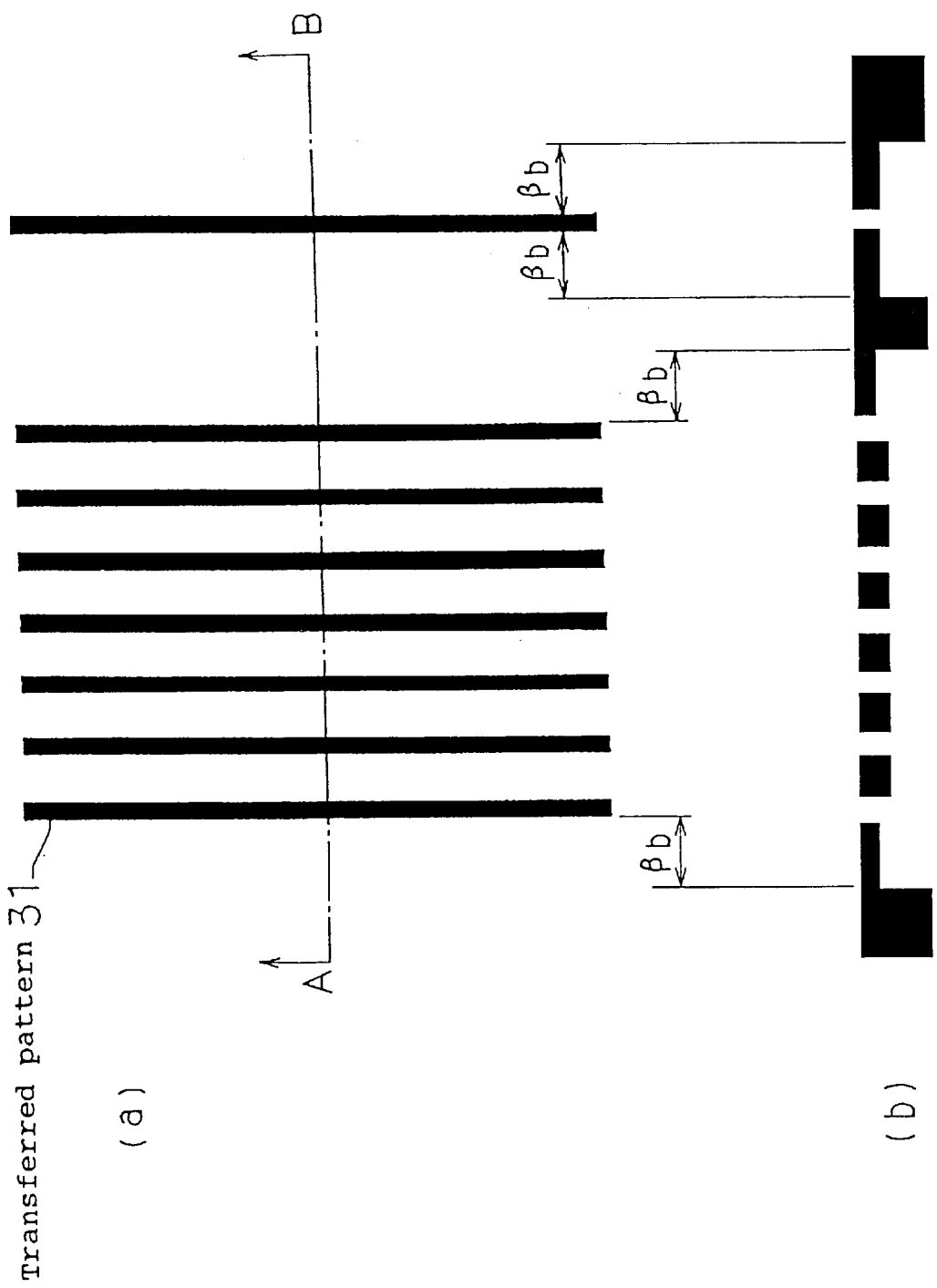
FIG. 7 is a schematic diagram illustrating one embodiment of a mask for electron-beam exposure according to the present invention.

This scattering stencil mask of the present invention is further described, referring to FIG. 7 that shows one embodiment thereof. FIG. 7(a) shows a transcription pattern 31 of line and space, while FIG. 7(b) shows a cross-sectional view of the mask corresponding to the view taken along the line A–B of FIG. 7(a). In these drawings, βb is a back-scattering range. The ration of the transcription pattern size to the mask size is, herein, set to be 1:1 so that the relationship between the transcription pattern and the mask may be seen clearly.

The scattering stencil mask of the present invention is a mask in which a substrate made of silicon or the like is provided an opening so as to form an opening pattern and this mask substrate has a scattering region with a thickness less than an electron penetration depth and said opening pattern is formed in this scattering region. Also this scattering region includes a region corresponding to a back-scattering range βb of the image-forming electrons in the wafer. Further, the thickness of this scattering region is varied according to the pattern density so as to make the correction dose optimum.

When the exposure is performed, using a scattering stencil mask in which an opening pattern is formed in the scattering region of the mask substrate, electrons passing through the opening section arrive on the wafer as image-forming electrons, while electrons transmitting the scattering region or the thinner region of the substrate become scattered electrons, most of which are blocked by the limiting aperture in the crossover plane. Consequently, with a scattering stencil mask of the present invention, an image contrast is formed on the wafer by the scattering contrast, while, with a conventional mask, an image contrast is formed by the absorbing contrast. Meanwhile, a part of the scattered electrons passing through the closed zonal opening in the limiting aperture arrive on the wafer as a correction beam, whereby the proximity effect correction is carried out. As seen above, in the scattering stencil mask, the scattering region corresponds to the scatterer layer 22 and the opening section, the electron-beam transmittable thin film (membrane 21) of the scattering membrane mask, respectively.

To allow an electron beam to transmit and scatter sufficiently, the thickness of scattering region of the scattering stencil mask of the present invention is set as follows. The upper limit for the thickness of the scattering region must be less than the electron-beam range (electron penetration depth), preferably less than ½ of the electron penetration depth. Further, it is preferably not greater than 25 times, more preferably not greater than 15 times and still more preferably not greater than 10 times of the mean free path. The lower limit for the thickness of the scattering region must be not less than the mean free path, preferably not less than 1.5 times, more preferably not less than 2 times and still more preferably not less than 3 times of the mean free path. Since the electron penetration depth and the mean free path very much depend on the mask substrate material and the accelerating voltage, the thickness of the scattering region is set appropriately, taking not only the pattern density but the mask substrate material and the accelerating voltage into consideration. The mean free path herein can be estimated using the equation described in Jpn. J. Appl. Phys., 10, pp.678 (1971). Further, the thickness of the scattering region in the mask substrate which is set as described above may be set so as to make a beam contrast preferably not less than 90%, more preferably not less than 95% and still more preferably not less than 98%. Moreover, in some cases, factors associated with manufacturing must be considered. For example, an aspect ratio of the opening in a silicon substrate is preferably set not exceeding 10, and it is preferable to consider this point as well in setting the thickness.

The scattering stencil mask of the present invention has the advantages that fabrication accuracy may be improved because an opening pattern is formed in a thinner scattering region and that generation of the heat in the mask due to electron-beam irradiation may be greatly reduced because most of the electron beam transmits the scattering region. However, if the scattering region in the mask substrate is excessively thin, the mask may lose mechanical strength. Therefore, as shown in FIG. 7(b), to keep up mechanical strength of the mask, the regions other than the scattering region are preferably formed thicker than the scattering region, preferably not less than twice of the scattering region.

For the scattering stencil mask of the present invention, for example, when a silicon substrate is employed and an accelerating voltage is 100 kV (an electron penetration depth is approximately 67 μm), the lower limit of the thickness of the scattering region of the silicon substrate is preferably not less than 0.3 mm, more preferably not less than 0.4 μm and still more preferably not less than 0.6 μm. The upper limit is preferably not greater than 5 μm, more preferably not greater than 3 μm and still more preferably not greater than 2 μm.

Another essential point for the scattering stencil mask of the present invention is that a mask substrate region (referred to as a "back-scattering mask substrate region" hereinafter) corresponding to a back-scattering range of the image-forming electrons in the wafer is also made to have the above thickness that is thinner than the electron penetration depth. In other words, the scattering region in the mask substrate must include the back-scattering substrate region. Unless electrons transmit sufficiently or enough scattered electrons are generated in the back-scattering substrate region, proximate effect correction cannot be satisfactorily carried out. As described above, since the scattered electrons must be defocused to about the back-scattering range to irradiate the wafer as a correction beam, the scattered electrons must be sent forth at least from the mask substrate region (the back-scattering mask substrate region) corresponding to the back-scattering range, as well. <Relationship between Thickness of Mask Scattering Region and Correction Dose>

Next, how changes in the thickness of the scattering region of the mask bring the control of the scattering angle of the scattered electrons and, consequently, the adjustment of the correction dose is described further.

Figure 8:
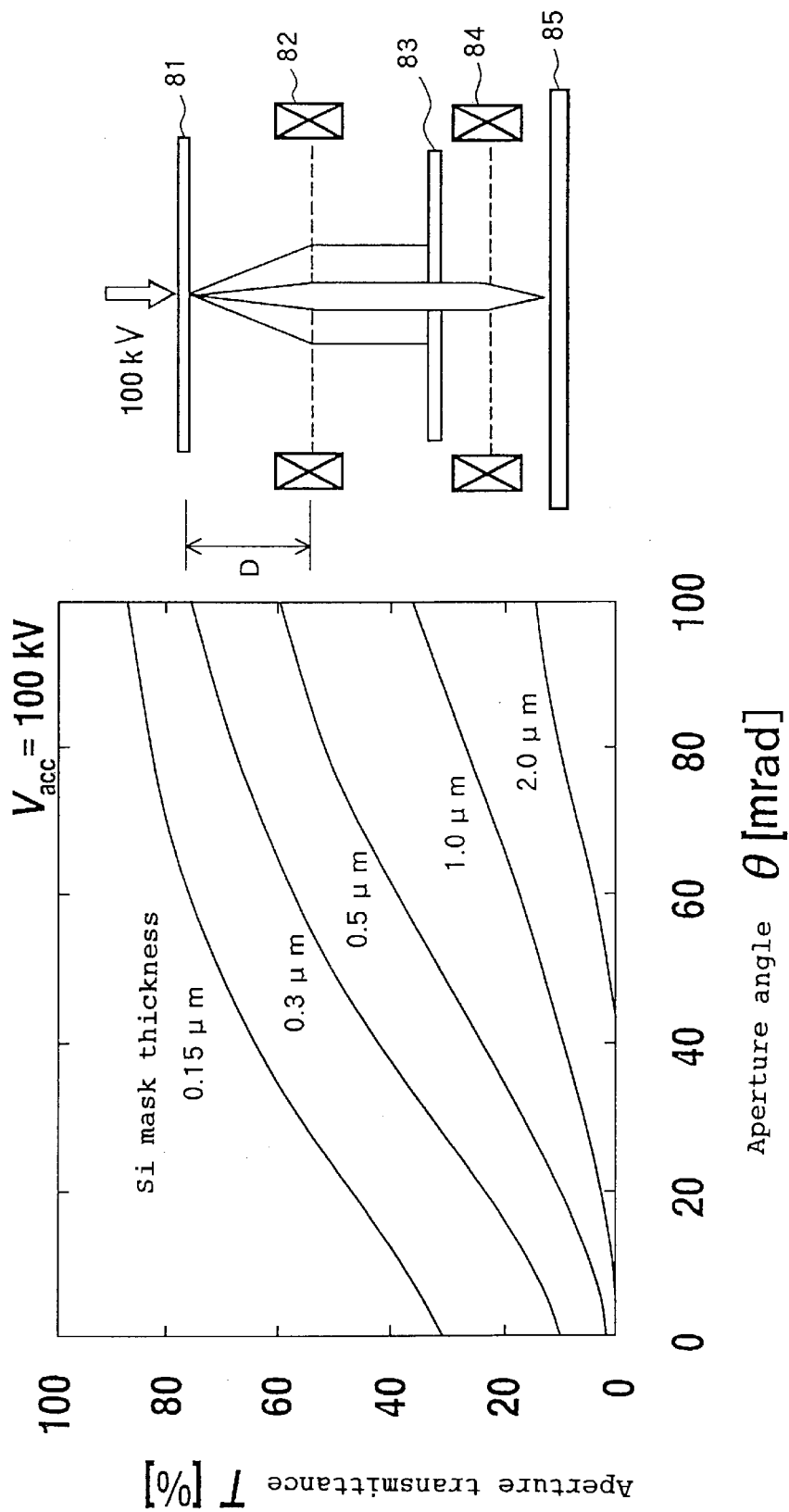
FIG. 8 is diagrams showing the relationship between the aperture transmittance of the scattered electrons that are scattered by transmitting the Si stencil mask (without an opening) and the aperture angle of the limiting aperture.

FIG. 8(a) is a graph showing the relationship between the aperture transmittance T (%) of the electrons that are scattered by transmitting a Si stencil mask (without an opening section) and the aperture angle θ (mrad) of a limiting aperture, as a function of Si mask thickness. The aperture transmittance T (%) herein indicates the ratio of the number of electrons falling on a wafer 85 to the number of mask-irradiating electrons. This relationship is obtained in an optical system shown in FIG. 8(b), using a limiting aperture that consists of solely an opening in the central section and do not include any annular opening, and masks having no opening pattern with thicknesses of 0.15 μm, 0.3 μm, 0.5 μm, 1.0 μm and 2.0 μm, respectively. The relationship between the aperture angle θ and the radius r of the opening in the central section of the limiting aperture 83 is given by r≈D·θ, where D is the distance between a mask 81 and a first projection lens 82.

As seen clearly in FIG. 8(a), as the aperture angle θ becomes larger (the radius r of the opening also becomes larger), the aperture transmittance T increases, and as the mask becomes thicker, the aperture transmittance decreases.

The above result that, with increasing the aperture angle θ, the aperture transmittance increases shows that with increasing the radius r of the opening, the amount of scattered electrons falling on the wafer becomes greater. Further, the aperture transmittance of the unscattered electrons is given, in FIG. 8(a), as the aperture transmittance at an aperture angle of 0.

On the other hand, the result that, with increasing the thickness of the mask, the aperture transmittance decreases indicates that as the mask becomes thicker, that is, the scattering region becomes thicker, the scattering angle of the electron beam becomes larger, which leads to a decrease in the amount of the scattered electrons falling on the wafer because the scattered electrons having larger scattering angles are cut off by the limiting aperture.

The present inventor recognized significance of these observations that, through changes in thickness of the scattering region of the mask, the scattering angle of the scattered electrons can be controlled, as described above, and thereby the amount of the scattered electrons falling on the wafer, that is, the correction dose can be adjusted, and has developed into the present invention.

Figure 9:
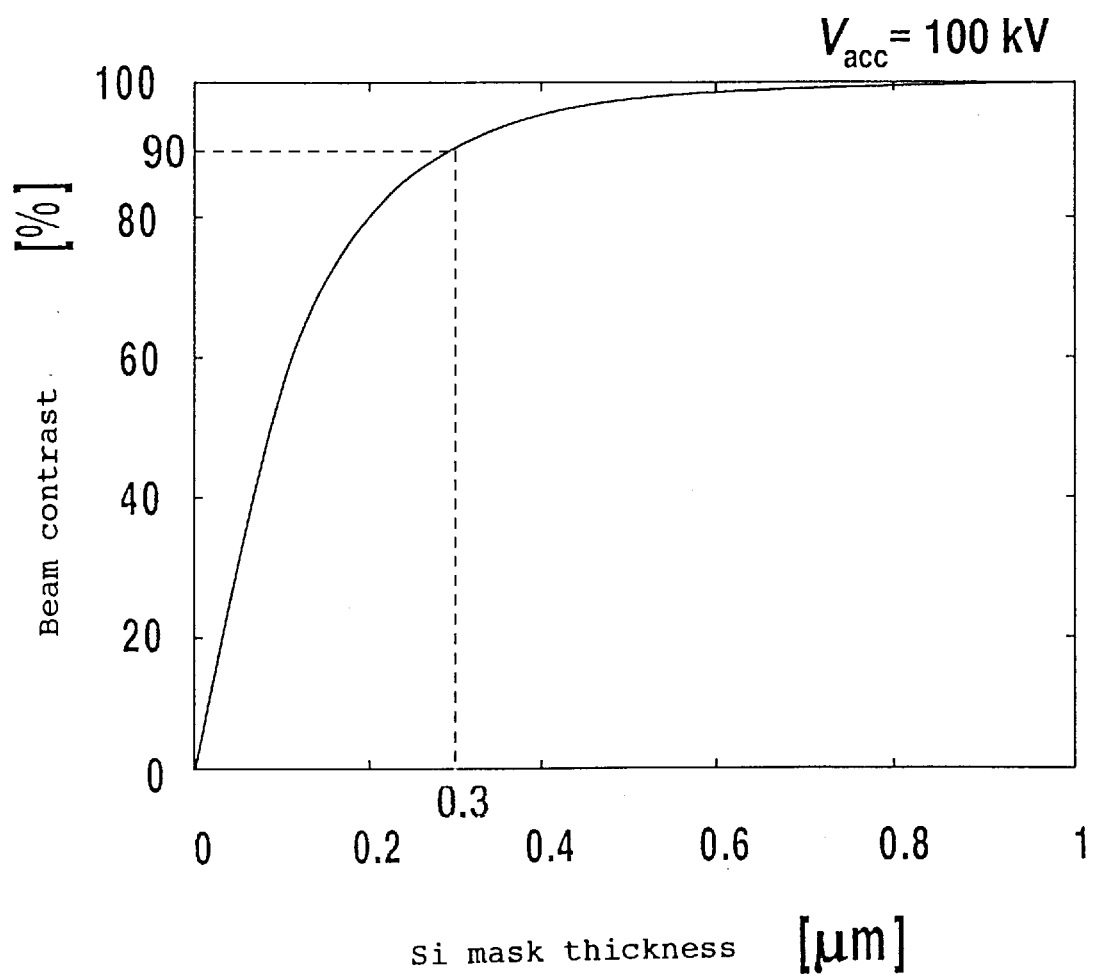
FIG. 9 is a plot showing the relationship between the beam contrast and the thickness of the Si stencil mask (without an opening).

Further FIG. 9 shows the relationship between the beam contrast and the thickness of the Si stencil mask (without an opening) at an accelerating voltage of 100 kV. The beam contrast C (%) herein is expressed by C=100−$T_0$ (%), where $T_0$ is the aperture transmission when the aperture angle is 0 mrad. For example, in FIG. 8(a), when the mask thickness is 0.3 μm, the aperture transmission $T_0$ is 10%, and, thus, the beam contrast becomes 90%, assuming that sufficient image contrast can be formed on the wafer under these conditions.
<Relationship between Pattern Density and Thickness of Mask Scattering Region>

Next, giving an example, the procedure of changing the thickness of the mask scattering region to adjust the correction dose to the pattern density is described below.

In this example, as s mask, there is employed a Si scattering stencil mask with line and space patterns, having two pattern regions, one with a pattern density of 50% (L/S=1/1) and the other, with a pattern density of 25% (L/S=1/3). A limiting aperture used herein comprises the central opening and an annular opening surrounding that central opening, and the aperture angle of the inner and outer radii of this annular opening are 20 and 40 mrad, respectively (the aperture angle of the medium radius is 30 mrad).

The conditions of exposure are the accelerating voltage is 100 keV and $F_1$=160 mm and $F_2$ =40 mm. If a Si wafer used has a back scattering range βb of 30 μm under these exposure conditions, for an objective lens of the optical system (a second projection lens 4), a lens having such a spherical aberration coefficient as to defocus the scattered electrons passing through said annular opening in the limiting aperture to about this back-scattering range βb (30 μm) should be chosen.

Assuming that the deposited energy of the forward-scattering electrons is 1, the deposited energy of the back-scattering electrons is, being given by the product of the pattern density (α) and the back-scattering coefficient (η), η/2 for the region with a pattern density of 50%, and η/4 for the region with a pattern density of 25%.

Next, using the deposited energy by back-scattering in the region having the largest pattern density as the standard, the correction dose is determined. For example, if the largest pattern density is 50%, the correction dose is chosen to make the deposited energy in all the pattern regions become η/2 (The correction dose for the region having the largest pattern density is 0, except in the vicinity of the borderline). In this instance, for the region with a pattern density of 25%, the correction dose corresponding η/4 (=η/2−η/4) is required. Therefore, for the region with a pattern density of 25%, the correction dose ratio δ of the correction beam passing through the annular opening in the limiting aperture becomes $\delta_{25}$=(0.25/0.75)×η/(1+η), and, if the back-scattering coefficient η=0.4, then $\delta_{25}$=0.095 (=9.5%). If the maximum pattern density and the pattern density in the other region are denoted by $\alpha_m$ and $\alpha_i$, respectively, the correction dose ratio $\delta_i$ for the region with the pattern density $\alpha_i$ is given, in a general expression, by $\delta_i$=(($\alpha_m$−$\alpha_i$)/(1−$\alpha_i$))×η/(1+η) (where 1≧$\alpha_m$−$\alpha_i$).

Figure 10:
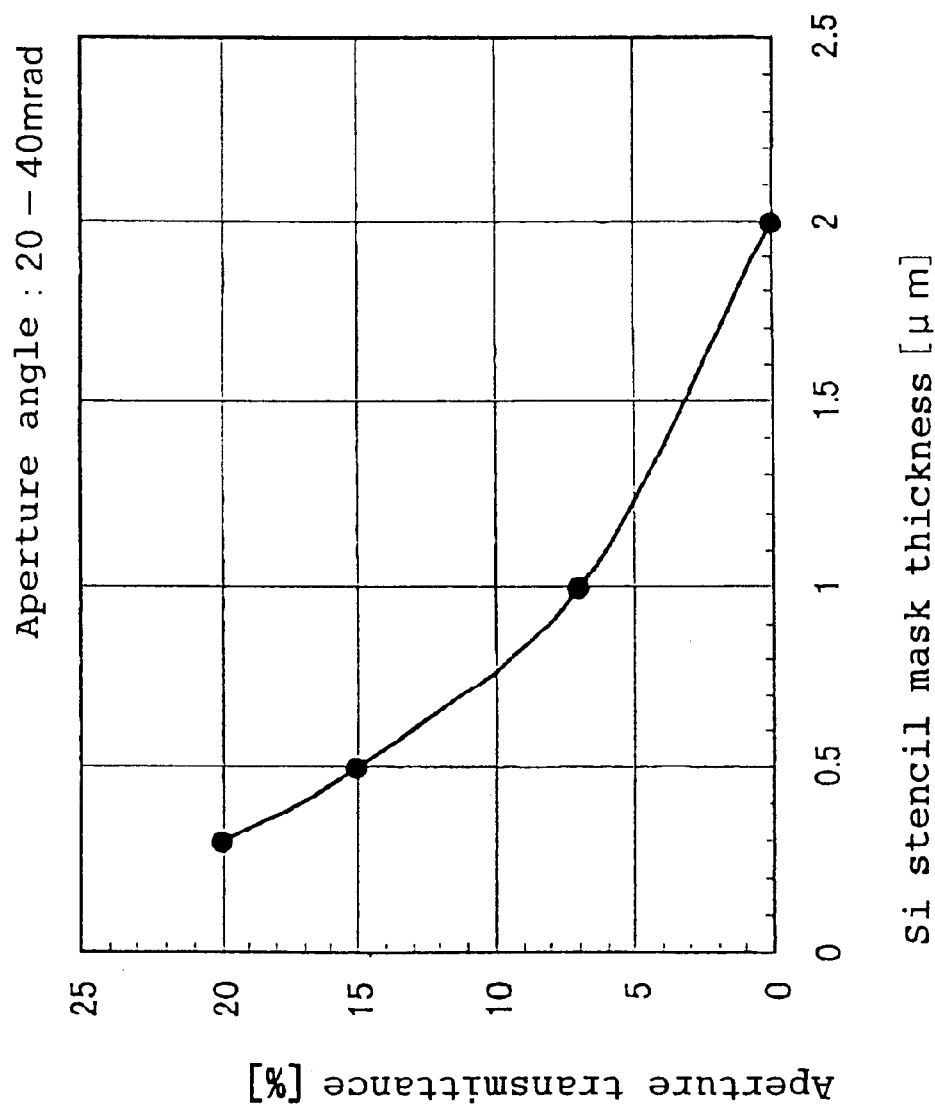
FIG. 10 is a plot showing the relationship between the aperture transmittance of the electrons after transmitting the Si stencil mask (without an opening) and the thickness of this Si stencil mask.

Now, FIG. 10 is a graph showing the relationship between the aperture transmittance and the mask thickness (the aperture angle of the annular opening: 20–40 mrad). As shown in FIG. 10, a mask thickness to provide an aperture transmittance of 9.5% that corresponds to the aforementioned $\delta_{25}=0.095$ (=9.5%) is 0.8 µm. Accordingly, the mask thickness of the region with a pattern density of 50% does not require any irradiation of the correction beam except the vicinity of the borderline, the mask thickness is set to be at least 2 µm so as to make the aperture transmittance 0% for the aperture angle of 20–40 mrad.

Further, although, in the above example, the correction dose for the region with the maximum pattern density is set 0 except around the borderline, the region with the maximum pattern density can be irradiated throughout with a correction beam as long as the required contrast can be obtained.

<Mask wherein Thickness of the Scattering Region is Changed according to the underlying Pattern>

Figure 11:
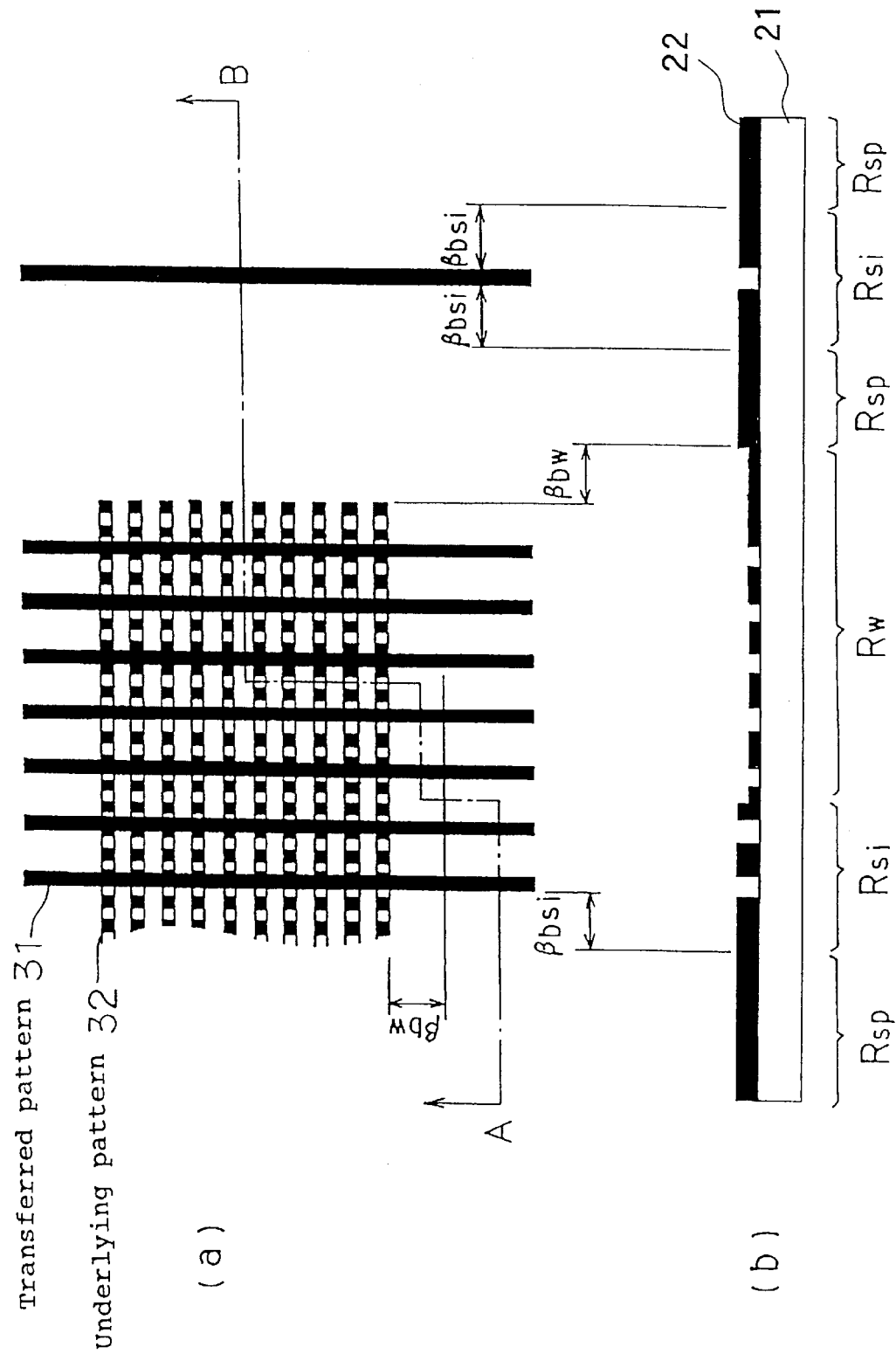
FIG. 11 is a schematic diagram illustrating another embodiment of a mask for electron-beam exposure according to the present invention.

Next, referring to FIG. 11, another embodiment of the mask for electron-beam exposure is described. FIG. 11(a) shows a transcription pattern 31 of line and space and an underlying pattern 32, while FIG. 11(b) shows a cross-sectional view of the mask corresponding to the view taken along the line A–B of FIG. 11(a). In these drawings, $\beta b_{si}$ is a back-scattering range caused by the silicon substrate and $\beta b_w$ is an additional back-scattering range to which the underlying pattern contributes. The ration of the transcription pattern size to the mask size is, herein, set to be 1:1 so that the relationship between the transcription pattern and the mask may be seen clearly.

The underlying pattern 32 comprises a gate, an interconnection and a filling-up section of a contact hole made of a material having a higher density than the wafer material and the heavy material constituting the underlying pattern may be a heavy metal such as a tungsten, copper, tantalum, cobalt, titanium, molybdenum and the like. The transmission pattern 31 of line and space corresponds to, for example, a pattern of a bit line or an aluminium interconnection.

Because, in this embodiment, it is taken into consideration that the back-scattering coefficient and the back-scattering range vary with the type of the material, the linewidth for the transcription pattern can be more accurately controlled.

In this embodiment, when a region with a different mask thickness is formed, the back-scattering to which the underlying pattern contributes should be taken into account. Setting of the thickness of this region with a different mask thickness may be made according to the back-scattering coefficients of the substrate material on the wafer side and the underlying pattern. Furthermore, the thickness of the region with a different mask thickness may be determined, considering no only the region directly corresponding to the underlying pattern formation region but also the region corresponding to the back-scattering range to which the underlying pattern contributes.

As shown in FIG. 11, the thickness of the scatterer layer 22 is the thinnest in the region $R_w$, where the underlying pattern 32 contributes to the back-scattering, while being slightly thicker in the region $R_{Si}$ where the underlying pattern 32 does not contribute to that. The thickness in the region $R_w$ is set less than that in the region $R_{Si}$ so that a more correction dose may be provided for irradiation of the wafer in order to compensate the increase of energy deposition due to the back-scattering to which the underlying pattern contributes. If the scattering region of the mask substrate corresponding to the back-scattering region to which the underlying pattern contributes is made thinner, in this manner, the proximity effect to which the back-scattering due to the underlying pattern contributes can be corrected and the linewidth accuracy of the resist pattern after development can be further improved.

As illustrated in FIG. 11, the above embodiment is an example in which the thickness of the scattering region of the mask substrate is changed solely according to the back-scattering to which the underlying pattern contributes, but regardless of the pattern density thereof. However, in setting the thickness of the scattering region of the mask substrate according to the mask pattern density, the thickness of the scattering region can be chosen, taking also the back-scattering to which the underlying pattern contributes into consideration. In this case, to find out the extent of the back-scattering in the back-scattering region to which the underlying pattern contributes, both the back-scattering coefficient of the wafer substrate and the back-scattering coefficient of the underlying pattern must be taken into account.

<Adaptation of the Present Invention to Complementary asks>

For the stencil mask, there is known a problem that a mask may be easily damaged when a mask has a pattern, for example, comprising bar-shaped patterns disposed to form all four sides or only three sides of a rectangle or a square. Because a section that supports the region surrounded by bar-shaped patterns and its adjacent region (for example, four corner sections for a square pattern) in such a mask occupies only an limited area and has a low strength, the mask may be easily damaged at the supporting section, while handling.

Accordingly, to solve this problem, sometimes called the doughnut problem or the leaf problem, there may be employed a method which comprises the steps of segmenting a given pattern into a plurality of patterns, manufacturing a suitable mask for every segmented pattern, and, using these masks, carrying out a plurality of electron-beam exposures and thereby accomplishing formation of a given pattern at the end. A set of these masks, each having a segmented pattern, are called complementary masks.

In a conventional SAL type electron-beam exposure method, if these complementary masks are used to form a prescribed pattern the following problem arises. Namely, since in the proximity effect correction that is performed simultaneously with the pattern exposure, the correction beam is provided for every mask, when exposure is made a plurality of times using a plurality of complementary masks to form a prescribed pattern, a superfluous irradiation of the correction beam is given at each exposure after the second exposure. As a result, because of the wrong correction dose, linewidth accuracy is lowered and the contrast is reduced.

To overcome this problem, in the present invention, in setting the thickness of the scattering region of the mask substrate according to the pattern density, the thickness of the scattering region of each complementary mask is set in such a way that the total correction dose for a plurality of exposures which are performed using a set of complementary masks as many times as the number of masks required to form a prescribed pattern equals to the correction dose when a prescribed pattern is formed using only one mask and through one exposure. The thickness of the scattering region of each mask substrate can be obtained, hereat, using the relationship between the aperture transmittance that corresponds to the correction dose ratio δ and the mask thickness, as shown in FIG. 10.

If complementary masks in which, as described above, the thickness of the scattering region is changed and the scattering angle is controlled, are used, simultaneously with performing formation of a prescribed pattern by using a set of complementary masks and carrying out electron-beam exposure as many times as required, the optimum proximity effect correction with a prescribed correction dose can be carried out.

<Manufacturing Method of a Mask>

Manufacturing Method of a Scattering Stencil Mask

Figure 12:
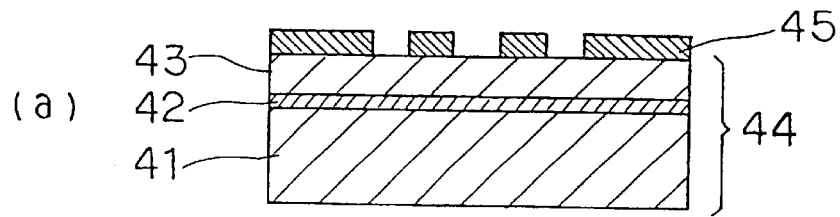
FIG. 12 is a series of cross-sectional views illustrating the steps of a conventional manufacturing method of a stencil mask.
Figure 12:
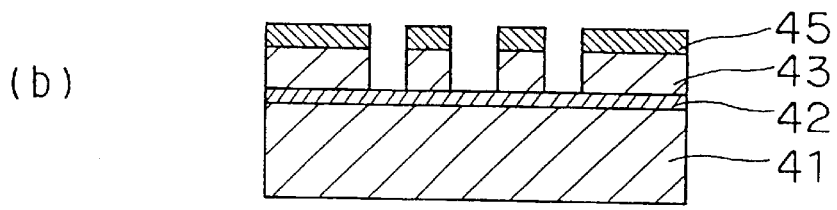
Figure 12:
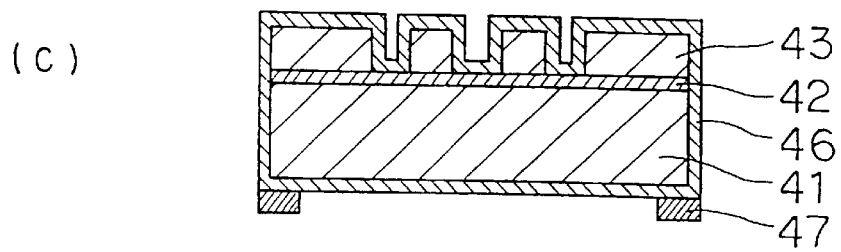
Figure 12:
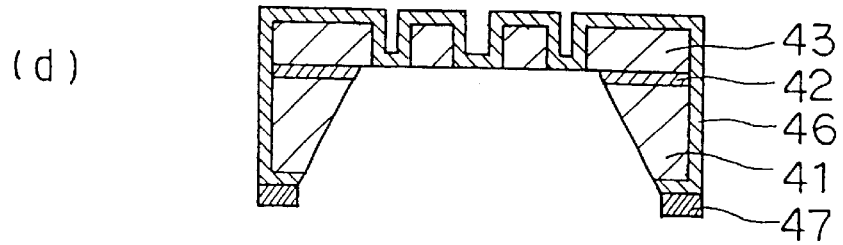
Figure 12:
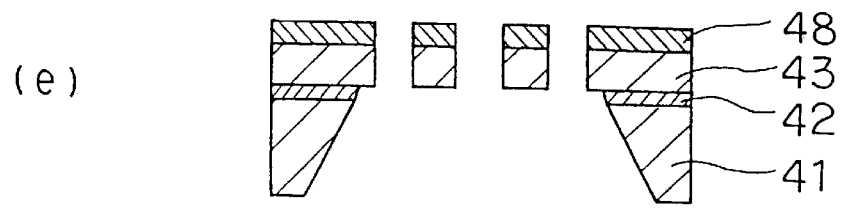

After a conventional method of manufacturing a stencil mask is described, referring to FIG. 12, an embodiment of a method of manufacturing a scattering stencil mask according to the present invention is described.

First, on a composite wafer 44 (Si/SiO$_2$/Si), a resist layer is formed and then patterned by lithography, as shown in FIG. 12(a), where referential numerals 41 and 43 represent Si layers and 42, a SiO$_2$ layer.

As shown in FIG. 12(b), using a patterned resist layer 45 as a mask, the Si layer 43 is dry-etched After removing the resist layer, a silicon nitride film 46 is then formed as a protective film for wet-etching that is to be performed in the later step, as shown in FIG. 12(c). Next, on the backside, a resist layer is formed and patterned to form a resist layer 47 with an opening window in the center thereof.

Next, as shown in FIG. 12(d), after removing the silicon nitride film in the opening section, the Si layer 41 exposed in the opening section is wet-etched by an alkaline solution such as a potassium hydroxide solution. The tapered shape of the Si layer 41 is formed making use of the orientation of the Si layer. Subsequently, the exposed SiO$_2$ film 42 is removed by wet-etching.

After that, as shown in FIG. 12(e), the resist layer 47 and the protective film 46 are removed, and a conductive film 48 made of, for example, gold, platinum or palladium is formed over the surface by the sputtering method or the like.

The scattering stencil mask of the present invention can be manufactured by applying the above steps of the manufacturing method.

In order to change the thickness of the scattering region in the mask partially, for example, the Si layer may be selectively removed by irradiating with an ion beam from the backside after forming the mask. Alternatively, after the step shown in FIG. 12(d), the resist layer 47 and the protective film 46 are removed and thereafter an ion beam is irradiated from the top surface to remove the Si layer prior to forming a conductive film 48 over the surface.

Figure 13:
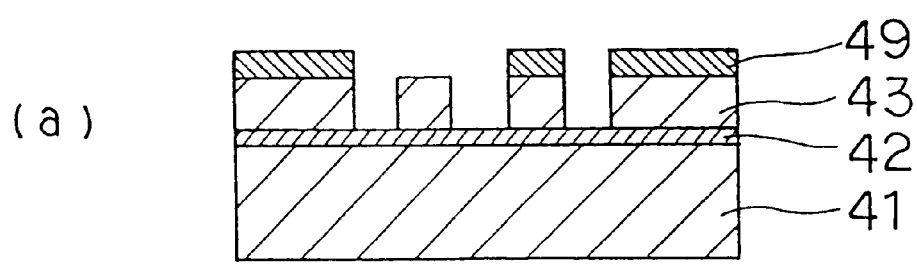
FIG. 13 is a series of cross-sectional views illustrating the steps of a manufacturing method of a stencil mask according to the present invention.
Figure 13:
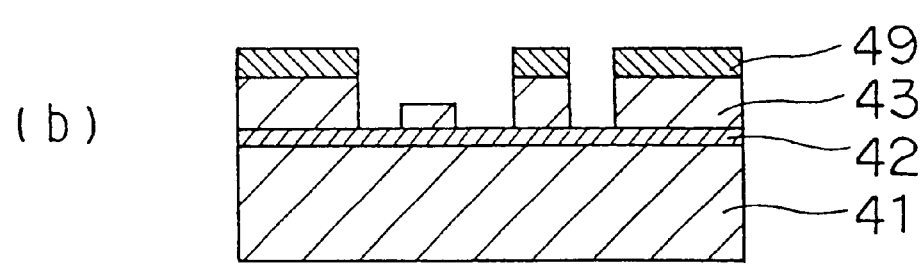

Alternatively, for example, after the step shown in FIG. 12(b), the resist layer 45 is removed, and thereafter a resist layer is formed and patterned by lithography (FIG. 13(a)), and then using the patterned resist layer 49 as a mask, dry etching is applied thereto and thereby a thinner region is formed partially (FIG. 13(b)). Alternatively, after the step shown in FIG. 12 (d), the resist layer 47 and a protective film 46 are removed and, thereafter, as described above, a resist layer is formed and patterned by lithography and then, using the patterned resist layer as a mask, dry etching is applied thereto, prior to formation of a conductive film 48 over the top surface. Such a step of forming a thinner region partially can be repeated for a plurality of regions together but each with different pattern densities.

Manufacturing Method of a Scattering Membrane Mask

After an example of a conventional method of manufacturing a scattering membrane mask is described, an embodiment of a method of manufacturing a scattering membrane mask according to the present invention is described. A further description of a conventional method of manufacturing s scattering membrane mask can be found elsewhere, for example, in SPIE, Vol. 3236, pp. 190 (1998).

First, upon a silicon substrate, silicon nitride films are formed as electron-beam transmittable thin films by the LPCVD (Low Pressure Chemical Vapour Deposition) method. The silicon nitride films are, hereat, formed on the both surfaces of the silicon substrate. Subsequently, over the silicon nitride film formed on the surface of the substrate, a tungsten layer is grown by means of the sputtering as a scatterer layer.

Nest, over the silicon nitride film formed on the backside of the silicon substrate, a coating of a resist is applied and patterned, and using the formed resist pattern as a mask, the silicon nitride film is removed by reactive ion etching so as to expose the silicon substrate in a prescribed region. Further, after this step, a tungsten layer may be formed over the silicon nitride film on the top surface of the substrate.

After the removal of the resist, by carrying out wet-etching with KOH, silicon in the exposed region of the silicon substrate is removed and thereby an opening section to expose the silicon nitride film formed on the top surface of the substrate is formed.

Next, over the tungsten layer lying on the top side of the substrate, a coating of a resist is applied and patterned, and using the formed resist pattern as a mask, the tungsten layer is patterned by dry etching. By removing the resist, a scattering membrane mask in which a tungsten layer pattern is formed on the silicon nitride film is obtained.

An example of a conventional manufacturing method is described so far. In this method, to change the thickness of the tungsten layer pattern partially, for example, the following steps can be taken. That is, the tungsten layer is first formed intentionally thicker than necessary, and then the process of lithography is repeated a plurality of times, varying the amount of etching for respective prescribed pattern regions, whereby a scatterer layer pattern having a different thickness partially can be formed.

Alternatively, in forming the tungsten layer over the silicon nitride film, the step of forming a resist pattern, performing the tungsten sputtering and removing the resist may be carried our for each prescribed regions, and, if the amount of the tungsten sputtering is varied with these respective steps, a scatterer layer pattern having a different thickness partially can be formed.

What is claimed is:

1. A scattering-angle limiting type electron-beam exposure method in which a mask having a scattering region is used, and a limiting aperture is set to control the amount of scattered electrons that are scattered by said mask to pass through, whereby a scattering contrast is formed from differences in the scattering angles of electrons within the electron beam having passed through said mask, and thereby pattern exposure is performed; wherein by changing the thickness of the scattering region of the mask according to the pattern density, the scattering angles of the scattered electrons are controlled and the amount of the scattered electrons to pass through the limiting aperture is adjusted, and, using these scattered electrons after passing through said limiting aperture for the correction exposure, the proximity effect correction is simultaneously performed during the pattern exposure.

2. The electron-beam exposure method according to claim 1, wherein said mask has a structure in which a scattering region made of an electron-beam scatterer with a prescribed pattern is formed over an electron-beam transmittable thin film.

3. The electron-beam exposure method according to claim 1, wherein said mask is a mask in which an opening pattern is formed by setting an opening section in the substrate, and said substrate has a scattering region thinner than the electron penetration depth, and said scattering region, having said opening pattern being formed therein, includes a region corresponding to a back-scattering range in the wafer.

4. The electron-beam exposure method according to claim 3, wherein said mask is one of a set of complementary masks that form a prescribed pattern by combining a plurality of mask patterns;

the scattering angles of the scattered electrons are controlled by setting the thickness of the scattering region of each complementary mask in such a way that the total correction dose for a plurality of exposures which are performed, using a set of these complementary masks, as many times as the number of masks required to form a prescribed pattern, equals to the correction dose when a prescribed pattern is formed using only one mask and through only one exposure; and simultaneously with forming a prescribed pattern by carrying out exposures as many times as required, using a set of these complementary masks, the proximity effect correction is performed, using the scattered electrons after passing through the limiting aperture for the correction exposure.

5. A scattering-angle limiting type electron-beam exposure method in which a mask having a scattering region is used, and a limiting aperture is set to control the amount of scattered electrons that are scattered by said mask to pass through, whereby a scattering contrast is formed from differences in the scattering angles of electrons within the electron beam having passed through said mask, and thereby pattern exposure is performed; wherein said mask has a structure in which a scattering region made of an electron-beam scatterer with a prescribed pattern is formed over an electron-beam transmittable thin film; and by changing the thickness of the electron-beam scatterer of the mask according to the back-scattering to which the underlying pattern of the wafer contributes, the scattering angles of the scattered electrons are controlled and the amount of the scattered electrons to pass through the limiting aperture is adjusted, and, using these scattered electrons after passing through said limiting aperture for the correction exposure, the proximity effect correction is simultaneously performed during the pattern exposure.

6. The electron-beam exposure method according to claim 1, wherein, in the scattering region of the mask that corresponds to the underlying pattern of the wafer and the back-scattering range to which said underlying pattern contributes, the thickness of the scattering region of the mask is set, while taking the back-scattering to which the underlying pattern contributes into account, whereby the scattering angles of the scattered electrons are controlled and the amount of the scattered electrons to pass through the limiting aperture is adjusted, and, using these scattered electrons after passing through said limiting aperture for the correction exposure, the proximity effect correction is simultaneously performed during the pattern exposure.

7. A scattering-angle limiting, electron beam exposure method comprising the steps of:

defining a pattern that has plural regions that each have a different pattern density with a mask that has a scattering layer thereon;

setting a thickness of the scattering layer in each of the regions based on the respective pattern density;

controlling scattering of electrons from an electron beam that have been scattered by the scattering layer by providing a limiting aperture through which a controlled amount of the scattered electrons passes; and making a proximity effect correction at a boundary between a first of the plural regions and a second of the plural regions by having the scattered electrons that have passed through the limiting aperture impinge upon the second region and an edge of the first region, an amount of the proximity effect correction being defined by the respective thickness of the scattering layer.

* * * * *